United States Patent
Kawashima et al.

(10) Patent No.: US 10,483,276 B2
(45) Date of Patent: Nov. 19, 2019

(54) SEMICONDUCTOR DEVICE AND METHOD OF MANUFACTURING SEMICONDUCTOR DEVICE

(71) Applicant: RENESAS ELECTRONICS CORPORATION, Tokyo (JP)

(72) Inventors: Yoshiyuki Kawashima, Tokyo (JP); Atsushi Yoshitomi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/020,094

(22) Filed: Jun. 27, 2018

(65) Prior Publication Data

US 2019/0035800 A1 Jan. 31, 2019

(30) Foreign Application Priority Data

Jul. 25, 2017 (JP) .................. 2017-143782

(51) Int. Cl.
| | |
|---|---|
| *H01L 27/11573* | (2017.01) |
| *H01L 27/11568* | (2017.01) |
| *H01L 21/28* | (2006.01) |
| *H01L 29/423* | (2006.01) |

(52) U.S. Cl.
CPC .. *H01L 27/11573* (2013.01); *H01L 21/28282* (2013.01); *H01L 27/11568* (2013.01); *H01L 29/4234* (2013.01)

(58) Field of Classification Search
CPC ......... H01L 27/11573; H01L 27/11568; H01L 21/28282; H01L 29/4234

USPC ........................................................... 257/324
See application file for complete search history.

(56) References Cited

U.S. PATENT DOCUMENTS

| 9,947,679 B2 | 4/2018 | Owada et al. | |
|---|---|---|---|
| 2010/0176439 A1* | 7/2010 | Yonamoto | H01L 21/28282 257/324 |
| 2016/0086961 A1* | 3/2016 | Owada | H01L 27/11546 438/258 |

FOREIGN PATENT DOCUMENTS

JP 2016-066674 A 4/2016

* cited by examiner

*Primary Examiner* — Tong-Ho Kim
(74) *Attorney, Agent, or Firm* — McDermott Will & Emery LLP

(57) ABSTRACT

To provide a semiconductor device capable of having an ONO-film-configuring second oxide film with an optimized thickness. The semiconductor device has a semiconductor substrate having a first surface, a first gate insulating film placed on the first surface located in a first transistor formation region, and a second gate insulating film placed on the first surface located in a second transistor formation region. The first gate insulating film has a first oxide film, a first nitride film placed thereon, and a second oxide film placed thereon. The second oxide film includes a first layer and a second layer placed thereon. The height of the first surface in a region where the second insulating film is placed is lower than that in a region where the first gate insulating film is placed. The nitrogen concentration in the first layer is higher than that in the second layer.

3 Claims, 13 Drawing Sheets

SEMICONDUCTOR DEVICE AND METHOD OF MANUFACTURING SEMICONDUCTOR DEVICE

CROSS-REFERENCE TO RELATED APPLICATIONS

The disclosure of Japanese Patent Application No. 2017-143782 filed on Jul. 25, 2017 including the specification, drawings and abstract is incorporated herein by reference in its entirety.

BACKGROUND

The present invention relates to a semiconductor device and a method of manufacturing a semiconductor device.

The semiconductor device described in Japanese Unexamined Patent Application Publication No. 2016-66674 (Patent Document 1) has conventionally been known. The semiconductor device described in Patent Document 1 has a MONOS (metal oxide nitride oxide silicon) transistor, a low voltage MISFET (metal insulator semiconductor field effect transistor) and a high voltage MISFET.

The MONOS transistor has an ONO (oxide nitride oxide) film to be placed on the main surface of a semiconductor substrate. The ONO film is made of a first oxide film located on the side of the semiconductor substrate, a nitride film placed on the first oxide film, and a second oxide film placed on the nitride film. The high voltage MISFET has a first gate insulating film placed on the main surface of the semiconductor substrate. The low voltage MISFET has a second gate insulating film placed on the main surface of the semiconductor substrate. The first gate insulating film is thicker than the second gate insulating film.

Patent Document

[Patent Document 1] Japanese Unexamined Patent Application Publication No. 2016-66674

SUMMARY

In the semiconductor device described in Patent Document 1, the second gate insulating film is formed by the thermal oxidation of the semiconductor substrate while exposing the second oxide film of the ONO film. During formation, therefore, the thickness of the second oxide film of the ONO film inevitably becomes thicker than that of the second oxide film of the ONO film at the time when it is just formed. In other words, the thickness of the second oxide film of the ONO film becomes thicker than the optimum film thickness.

Other problems and novel features will be apparent from the description herein and accompanying drawings.

A semiconductor device according to one embodiment is equipped with a semiconductor substrate having a first surface and a second surface which is a surface opposite to the first surface, a first gate insulating film placed on the first surface located in a first-transistor formation region and a second gate insulating film placed on the first surface located in a second-transistor formation region. The first gate insulating film has a first oxide film, a first nitride film placed on the first oxide film, and a second oxide film placed on the first nitride film. The second oxide film includes a first layer and a second layer placed thereon. The height of the first surface in a region where the second gate insulating film is placed is lower than the height of the first surface in a region where the first insulating film is placed. The nitrogen concentration in the first layer is higher than that in the second layer.

According to the semiconductor device of the one embodiment, the thickness of the second oxide film can be optimized.

DETAILED DESCRIPTION

Figure 1:
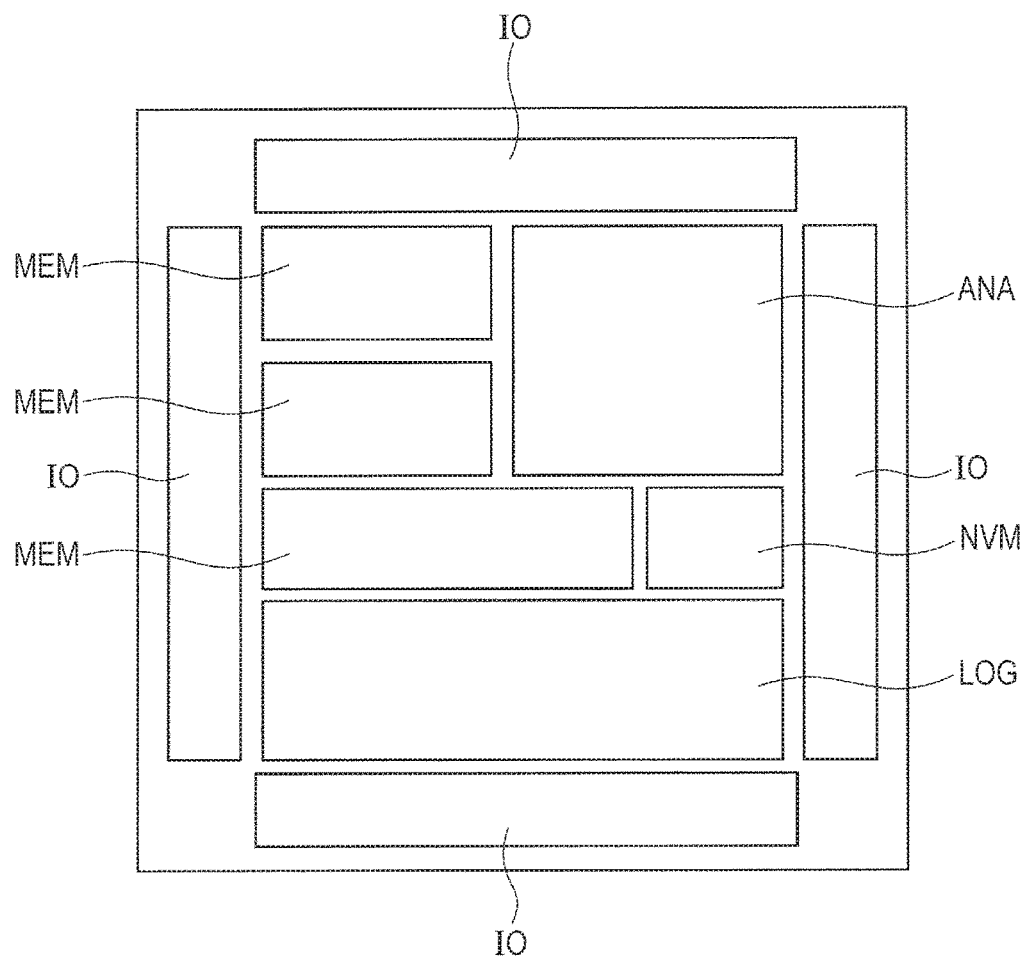
FIG. 1 is a schematic layout diagram of a semiconductor device of First Embodiment.

First Embodiment will be described in detail referring to some drawings. In the drawings shown below, the same or like members will be identified by the same reference numerals and overlapping descriptions will be omitted.

(Configuration of Semiconductor Device of First Embodiment)

The configuration of the semiconductor device of First Embodiment will hereinafter be described.

Figure 2:
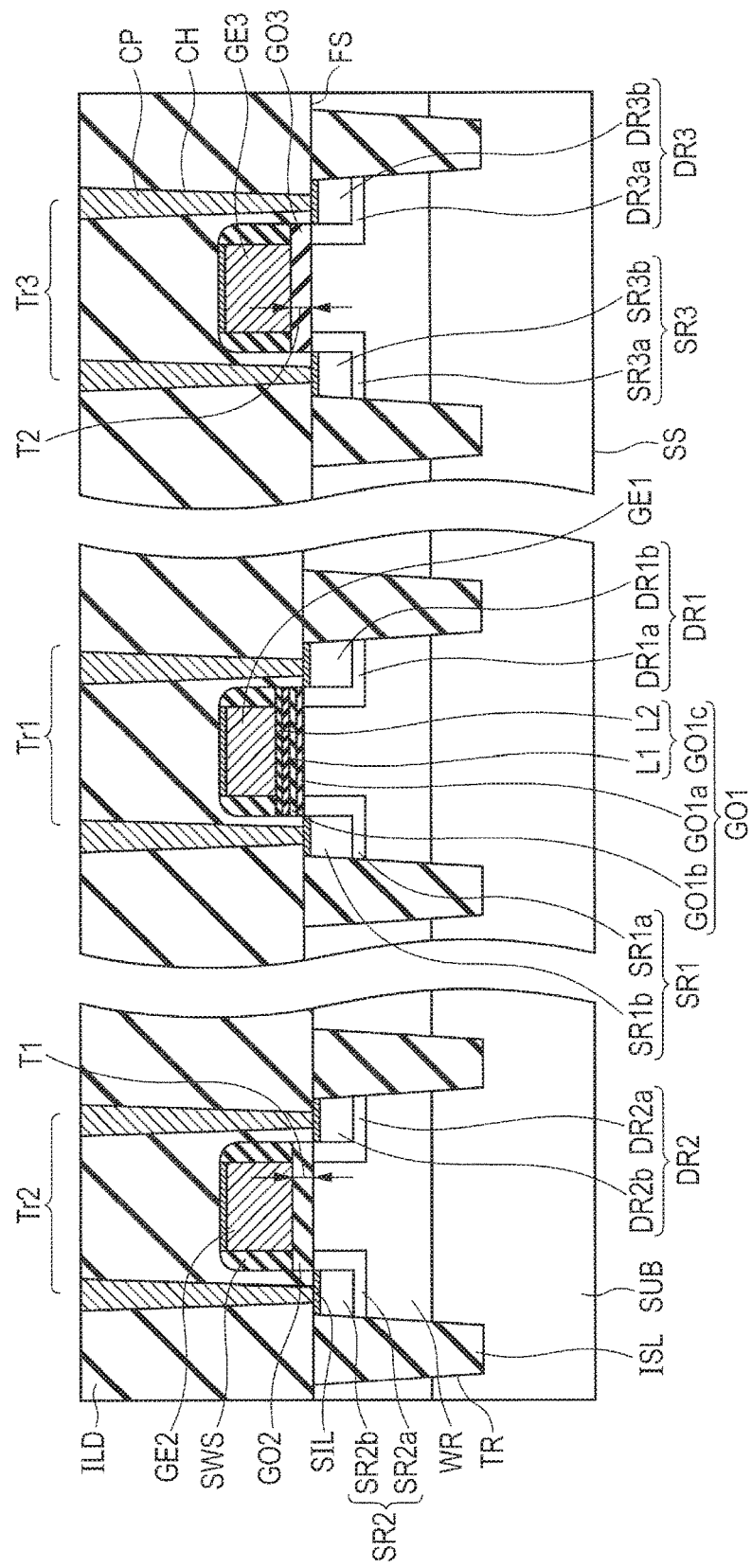
FIG. 2 is a cross-sectional view of the semiconductor device of First Embodiment.

As shown in FIG. 1, the semiconductor device of First Embodiment has, for example, an input/output circuit IO, an analogue circuit ANA, a memory circuit MEM, a logic circuit LOG, and a nonvolatile memory circuit NVM. As shown in FIG. 2, the semiconductor device of First Embodiment has a first transistor Tr1 and a second transistor Tr2. The first transistor Tr1 is a MOS transistor. The semiconductor device of First Embodiment may have a third transistor Tr3. The input/output circuit IO and the analogue circuit ANA each include the second transistor Tr2.

The memory circuit MEM includes, for example, a RAM (random access memory) circuit and a ROM (read only memory) circuit. The logic circuit LOG is, for example, a CPU (central processing unit). The memory circuit MEM and the logic circuit LOG each include the third transistor Tr3. The nonvolatile memory circuit NVM includes the first transistor Tr1.

The semiconductor device of First Embodiment has a semiconductor substrate SUB, a first gate insulating film GO1, a second gate insulating film GO2, a third gate insulating film GO3, a gate electrode GE1, a gate electrode GE2, and a gate electrode GE3.

The semiconductor device of First Embodiment further has element isolation films ISL, sidewall spacers SWS, an interlayer insulating film ILD, and contact plugs CP.

For the semiconductor substrate SUB, for example, single crystal silicon (Si) is used. The semiconductor substrate SUB has a first surface FS and a second surface SS. The second surface SS is a surface opposite to the first surface FS. The semiconductor substrate SUB has a source region SR1, a drain region DR1, a source region SR2, a drain region DR2, a source region SR3, a drain region DR3, and a well region WR.

The source region SR1, the source region SR2, the source region SR3, the drain region DR1, the drain region DR2, and the drain region DR3 are placed in the first surface FS. Respective portions of the source region SR1, the source region SR2, the source region SR3, the drain region DR1, the drain region DR2, and the drain region DR3 on the first surface FS side thereof may each be a silicide film SIL. The source region SR1 exists separated from the drain region DR1. The source region SR2 exists separated from the drain region DR2. The source region SR3 exists separated from the drain region DR3.

The source region SR1 has a first portion SR1$a$ and a second portion SR1$b$. The first portion SR1$a$ is placed so as to overlap with one of the sidewall spacers SWS. The first portion SR1$a$ is placed around the second portion SR1$b$. The impurity concentration in the first portion SR1$a$ is lower than that in the second portion SR1$b$. This means that the first portion SR1$a$ has an LDD (lightly doped diffusion) structure.

The source region SR2 has a first portion SR2$a$ and a second portion SR2$b$. The first portion SR2$a$ is placed so as to overlap with one of the sidewall spacers SWS. The first portion SR2$a$ is placed around the second portion SR2$b$. The impurity concentration in the first portion SR2$a$ is lower than that in the second portion SR2$b$. This means that the first portion SR2$a$ has an LDD structure.

The source region SR3 has a first portion SR3$a$ and a second portion SR3$b$. The first portion SR3$a$ is placed so as to overlap with one of the sidewall spacers SWS. The first portion SR3$a$ is placed around the second portion SR3$b$. The impurity concentration in the first portion SR3$a$ is lower than that in the second portion SR3$b$. This means that the first portion SR3$a$ has an LDD structure.

The drain region DR1 has a first portion DR1$a$ and a second portion DR1$b$. The first portion DR1$a$ is placed so as to overlap with one of the sidewall spacers SWS. The first portion DR1$a$ is placed around the second portion DR1$b$. The impurity concentration in the first portion DR1$a$ is lower than that in the second portion DR1$b$. This means that the first portion DR1$a$ has an LDD structure.

The drain region DR2 has a first portion DR2$a$ and a second portion DR2$b$. The first portion DR2$a$ is placed so as to overlap with one of the sidewall spacers SWS. The first portion DR2$a$ is placed around the second portion DR2$b$. The impurity concentration in the first portion DR2$a$ is lower than that in the second portion DR2$b$. This means that the first portion DR2$a$ has an LDD structure.

The drain region DR3 has a first portion DR3$a$ and a second portion DR3$b$. The first portion DR3$a$ is placed so as to overlap with one of the sidewall spacers SWS. The first portion DR3$a$ is placed around the second portion DR3$b$. The impurity concentration in the first portion DR3$a$ is lower than that in the second portion DR3$b$. This means that the first portion DR3$a$ has an LDD structure.

The well region WR is placed to surround the source region SR1, the source region SR2, the source region SR3, the drain region DR1, the drain region DR2, and the drain region DR3. The well region WR has a portion sandwiched between the source region SR1 and the drain region DR1, a portion sandwiched between the source region SR2 and the drain region DR2 and a portion sandwiched between the source region SR3 and the drain region DR3.

The portion of the well region WR sandwiched between the source region SR1 and the drain region DR1, the portion of the well region WR sandwiched between the source region SR2 and the drain region DR2, and the portion of the well region WR sandwiched between the source region SR3 and the drain region DR3 are each placed in the first surface FS.

The source region SR1, the source region SR2, the source region SR3, the drain region DR1, the drain region DR2, and the drain region DR3 each have a first conductivity type. The well region WR has a second conductivity type. The second conductivity type is a conductivity type opposite to the first conductivity type. The first conductivity type is, for example, a p type. The second conductivity type is, for example, an n type. This means that the second transistor Tr2 and the third transistor Tr3 are, for example, a p channel transistor.

First conductivity type regions of the semiconductor substrate SUB (for example, the source region SR1, the source region SR2, the source region SR3, the drain region DR1, the drain region DR2, and the drain region DR3) each contain an acceptor element such as boron (B) as an impurity. A second conductivity type region of the semiconductor substrate SUB (for example, the well region WR) contains a donor element such as phosphorus (P) or arsenic (As) as an impurity.

The first gate insulating film GO1 is placed on the first surface FS located in a region where the first transistor Tr1 is to be formed. More specifically, the first gate insulating film GO1 is formed on the portion of the well region WR sandwiched between the source region SR1 and the drain region DR1.

The first gate insulating film GO1 has a first oxide film GO1$a$, a first nitride film GO1$b$, and a second oxide film GO1$c$. The first oxide film GO1$a$ is placed on the first surface FS. The first nitride film GO1$b$ is placed on the first oxide film GO1$a$. The second oxide film GO1$c$ is placed on the first nitride film GO1$b$.

The first oxide film GO1$a$ is made of an oxide. For the formation of the first oxide film GO1$a$, for example, $SiO_2$ is used. The first nitride film GO1$b$ is made of a nitride. For the formation of the first nitride film GO1$b$, for example, silicon nitride ($Si_3N_4$) is used. The second oxide film GO1$c$ is made of an oxide. For the formation of the second oxide film GO1$c$, for example, $SiO_2$ is used. In short, the first gate insulating film GO1 is an ONO film.

The second oxide film GO1$c$ has a first layer L1 and a second layer L2. The first layer L1 is placed on the first nitride film GO1$b$. The second layer L2 is placed on the first layer L1. The nitrogen concentration in the first layer L1 is higher than that in the second layer L2. The nitrogen concentration in the first layer L1 being higher than that in the second layer L2 means that the maximum nitrogen concentration in the first layer L1 is higher than that in the second layer L2. The nitrogen concentration in the first layer L1 and the second layer L2 is measured using electron energy-loss spectroscopy or energy dispersive X-ray spectrometry.

The second gate insulating film GO2 is placed on the first surface FS located in a region where the second transistor Tr2 is to be formed. More specifically, the second gate insulating film GO2 is placed on the portion of the well region WR sandwiched between the source region SR2 and the drain region DR2. For the second gate insulating film GO2, for example, silicon dioxide ($SiO_2$) is used. The second gate insulating film GO2 is, for example, a thermal oxide film. The second gate insulating film GO2 has a thickness T1. The nitrogen concentration in the second gate insulating film GO2 is lower than that in the first oxide film GO1a.

The third gate insulating film GO3 is placed on the first surface FS located in a region where the third transistor Tr3 is to be formed. More specifically, the third gate insulating film GO3 is placed on the portion of the well region WR sandwiched between the source region SR3 and the drain region DR3. For the third gate insulating film GO3, for example, $SiO_2$ is used. The third gate insulating film GO3 is, for example, a thermal oxide film. The third gate insulating film GO3 has a thickness T2. The thickness T1 is thicker than the thickness T2. The nitrogen concentration in the third gate insulating film GO3 is lower than that in the first oxide film GO1a.

The first gate insulating film GO1, the second gate insulating film GO2, and the third gate insulating film GO3 are placed so as not to overlap with one another in plan view (when viewed from a direction orthogonal to the first surface FS).

The height of the first surface FS in a region where the second gate insulating film GO2 is placed is lower than the height of the first surface FS in a region where the first gate insulating film GO1 is placed. The height of the first surface FS in a region where the third insulating film GO3 is placed is lower than the height of the first surface FS in a region where the second gate insulating film GO2 is placed.

The gate electrode GE1 is placed on the first gate insulating film GO1. More specifically, the gate electrode GE1 is opposite to and insulated from the portion of the well region WR sandwiched between the source region SR1 and the drain region DR1.

The gate electrode GE2 is placed on the second gate insulating film GO2. More specifically, the gate electrode GE2 is opposite to and insulated from the portion of the well region WR sandwiched between the source region SR2 and the drain region DR2.

The gate electrode GE3 is placed on the second gate insulating film GO3. More specifically, the gate electrode GE3 is opposite to and insulated from the portion of the well region WR sandwiched between the source region SR3 and the drain region DR3.

For the gate electrode GE1, the gate electrode GE2, and the gate electrode GE3, for example, impurity-doped polycrystalline Si is used. The gate electrode GE1, the gate electrode GE2, and the gate electrode GE3 may have, on the upper surface side thereof, the silicide film SIL.

The source region SR1, the drain region DR1, the portion of the well region WR sandwiched between the source region SR1 and the drain region DR1, the first gate insulating film GO1, and the gate electrode GE1 configure the first transistor Tr1.

The source region SR2, the drain region DR2, the portion of the well region WR sandwiched between the source region SR2 and the drain region DR2, the second gate insulating film GO2, and the gate electrode GE2 configure the second transistor Tr2.

The source region SR3, the drain region DR3, the portion of the well region WR sandwiched between the source region SR3 and the drain region DR3, the third gate insulating film GO3, and the gate electrode GE3 configure the third transistor Tr3.

The element isolation films ISL are each placed in the first surface FS of the semiconductor substrate SUB. Described specifically, the first surface FS has therein trenches TR. The trenches TR each extend from the first surface FS to the second surface SS. With the element isolation films ISL, the trenches TR are filled, respectively. In short, the element isolation films ISL are each STI (shallow trench isolation).

The element isolation films ISL may each be LOCOS (local oxidation of silicon). The element isolation films ISL insulate and separate the first transistor Tr1, the second transistor Tr2, and the third transistor Tr3 from one another. For the element isolation films ISL, for example, $SiO_2$ is used.

The sidewall spacers SWS are placed on the side walls of the gate electrode GE1, the gate electrode GE2, and the gate electrode GE3, respectively. For the sidewall spacers SWS, for example, $Si_3N_4$ is used.

The interlayer insulating film ILD is placed on the first surface FS of the semiconductor substrate SUB. The interlayer insulating film ILD covers the gate electrode GE1, the gate electrode GE2, the gate electrode GE3, and the sidewall spacers SWS. The interlayer insulating film ILD has therein contact holes CH.

The contact holes CH penetrate the interlayer insulating film ILD. The source region SR1, the source region SR2, the source region SR3, the drain region DR1, the drain region DR2, and the drain region DR3 are exposed from the contact holes CH. Although not illustrated in FIG. 2, also the gate electrode GE1, gate electrode GE2, and the gate electrode GE3 are exposed from the contact holes CH. For the interlayer insulating film ILD, for example, $SiO_2$ is used.

The contact plugs CP are placed in the interlayer insulating film ILD. More specifically, with the contact plugs CP, the contact holes CH are filled, respectively. The contact plugs CP are electrically coupled to the source region SR1, the source region SR2, the source region SR3, the drain region DR1, the drain region DR2, the drain region DR3, the gate electrode GE1, the gate electrode GE2, and the gate electrode GE3. For the contact plugs CP, for example, tungsten (W) is used.

Although not illustrated in FIG. 2, the interlayer insulating film ILD has thereon a wiring. A multilayer wiring structure may be formed by forming, on the interlayer insulating film ILD and this wiring, an interlayer insulating film, a via plug, and a wiring in repetition.

(Method of Manufacturing a Semiconductor Device According to First Embodiment)

A method of manufacturing a semiconductor device according to First Embodiment will hereinafter be described.

Figure 3:
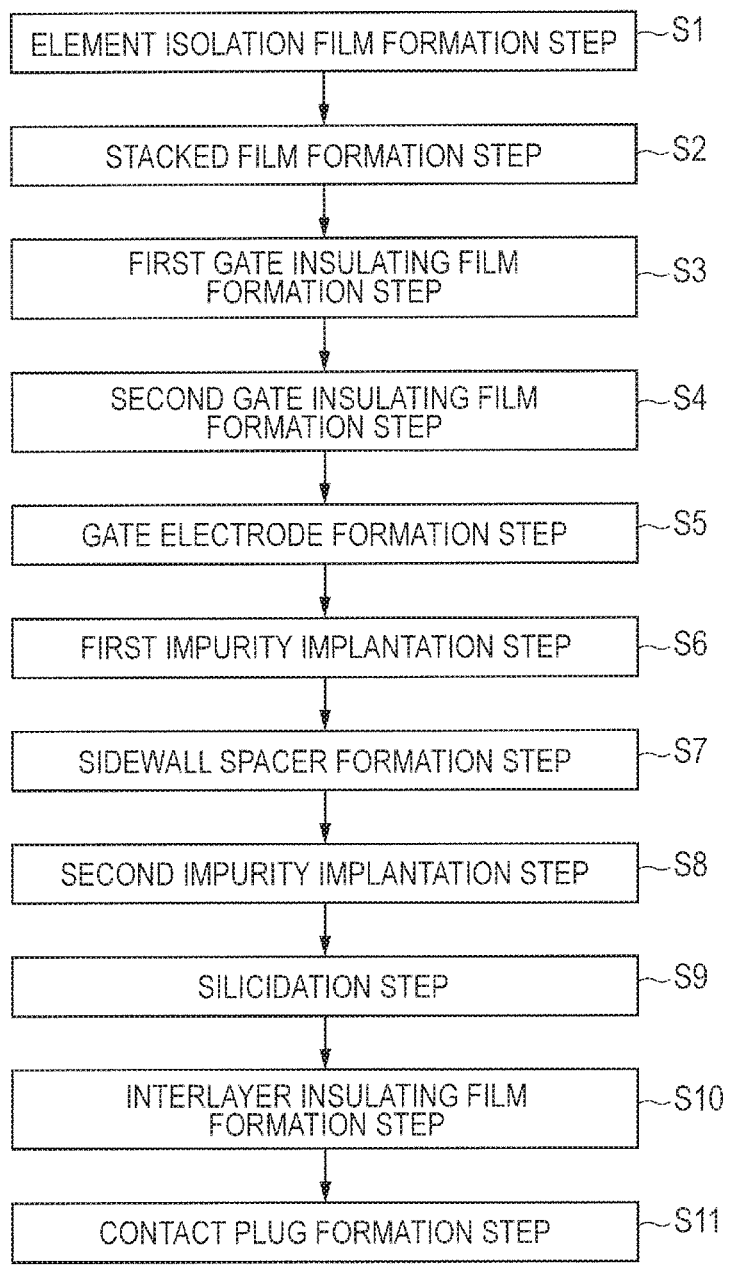
FIG. 3 is a step chart showing a method of manufacturing the semiconductor device of First Embodiment.

As shown in FIG. 3, the method of manufacturing a semiconductor device according to First Embodiment has an element isolation film formation step S1, a stacked film formation step S2, a first gate insulating film formation step S3, a second gate insulating film formation step S4, a gate electrode formation step S5, a first impurity implantation step S6, a sidewall spacer formation step S7, a second impurity implantation step S8, and a silicidation step S9. The method of manufacturing a semiconductor device according to First Embodiment further has an interlayer insulating film formation step S10 and a contact plug formation step S11.

Figure 4:
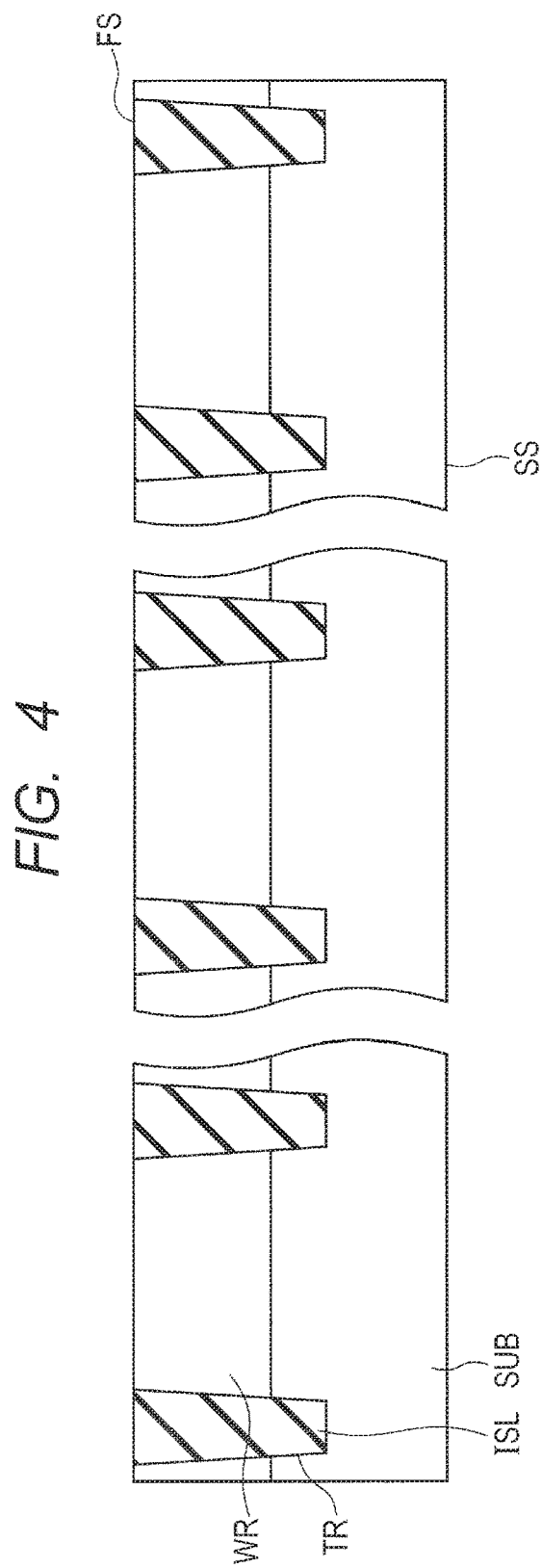
FIG. 4 is a cross-sectional view of the semiconductor device of First Embodiment in an element isolation film formation step.

As shown in FIG. 4, in the element isolation film formation step S1, element isolation films ISL are formed. In the element isolation film formation step S1, firstly, trenches TR are formed in a first surface FS of a semiconductor substrate SUB. The trenches TR are formed by anisotropic etching such as RIE (reactive ion etching).

In the element isolation film formation step S1, secondly, the trenches are filled with a material configuring the element isolation film ISL. Filling of the trenches with the material configuring the element isolation film ISL is performed, for example, by CVD (chemical vapor deposition).

In the element isolation film formation step S1, thirdly, a protruding portion of the material configuring the element isolation film ISL from the trenches TR is removed. Removal of the material configuring the element isolation films ISL which has protruded from the trenches TR is performed, for example, by CMP (chemical mechanical polishing).

Figure 5:
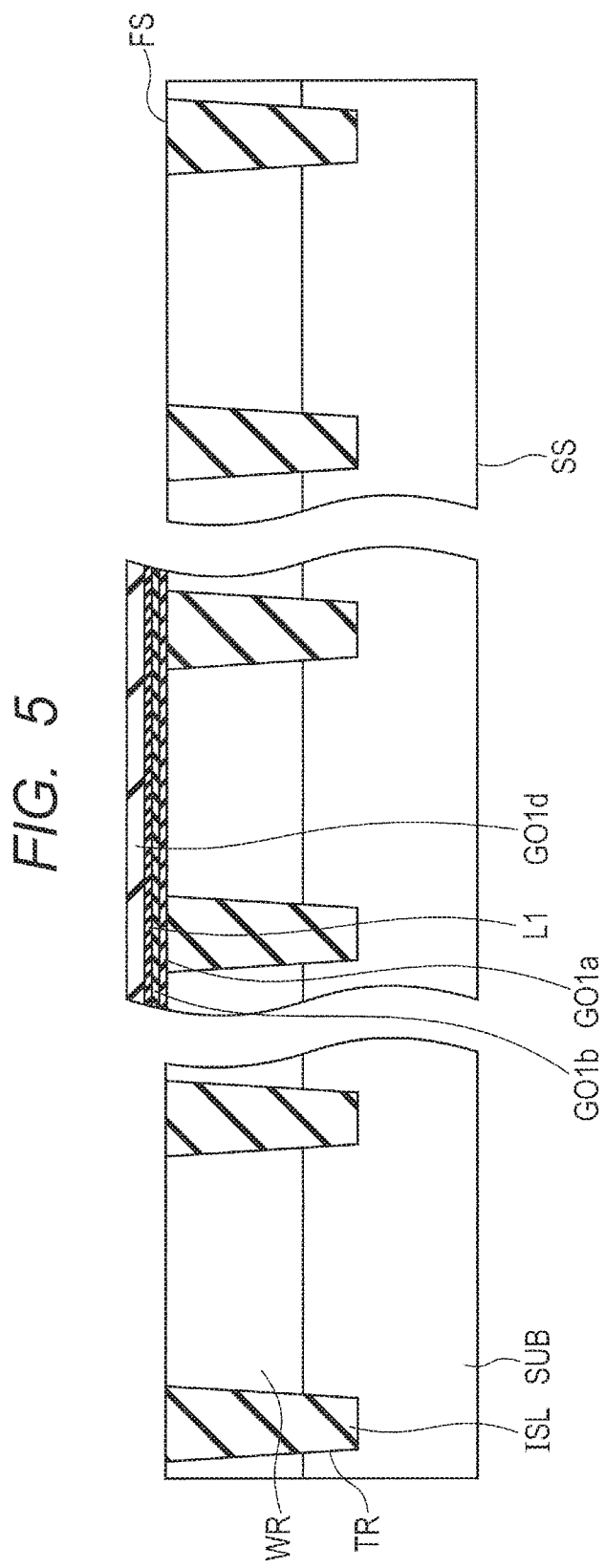
FIG. 5 is a cross-sectional view of the semiconductor device of First Embodiment in a stacked film formation step.

As shown in FIG. 5, in the stacked film formation step S2, a first oxide film GO1$a$, a first nitride film GO1$b$, a first layer L1, and a second nitride film GO1$d$ are formed. The second nitride film GO1$d$ is placed on the first layer L1.

In the stacked film formation step S2, firstly, film formation is performed using respective materials configuring the first oxide film GO1$a$, the first nitride film GO1$b$, the first layer L1, and the second nitride film GO1$d$. Film formation with the material configuring the first oxide film GO1$a$ is performed by thermal oxidation such as ISSG (in-situ steam generation). Film formation with the respective materials configuring the first nitride film GO1$b$, the first layer L1, and the second nitride film GO1$d$ is performed, for example, by CVD.

In the stacked film formation step S2, secondly, patterning of the respective materials configuring the first oxide film GO1$a$, the first nitride film GO1$b$, the first layer L1, and the second nitride film GO1$d$ is performed. Patterning of the respective materials configuring the first oxide film GO1$a$, the first nitride film GO1$b$, the first layer L1, and the second nitride film GO1$d$ is performed, for example, by photolithography and etching.

In the stacked film formation step S2, thirdly, the first oxide film GO1$a$ is heat treated. The first oxide film GO1$a$ is heat treated, for example, in a nitrogen monoxide (NO) atmosphere. The first oxide film GO1$a$ is heat treated under a temperature condition of, for example, 950° C. By this heat treatment, nitrogen is introduced into the first oxide film GO1$a$.

When the second gate insulating film formation step S4 is performed (in other words, the semiconductor device of First Embodiment has the third gate insulating film GO3), the second nitride film GO1$d$ thus formed has preferably a thickness not allowing complete oxidation (thickness allowing remaining of an unoxidized portion) in the first gate insulating film formation step S3.

Figure 6:
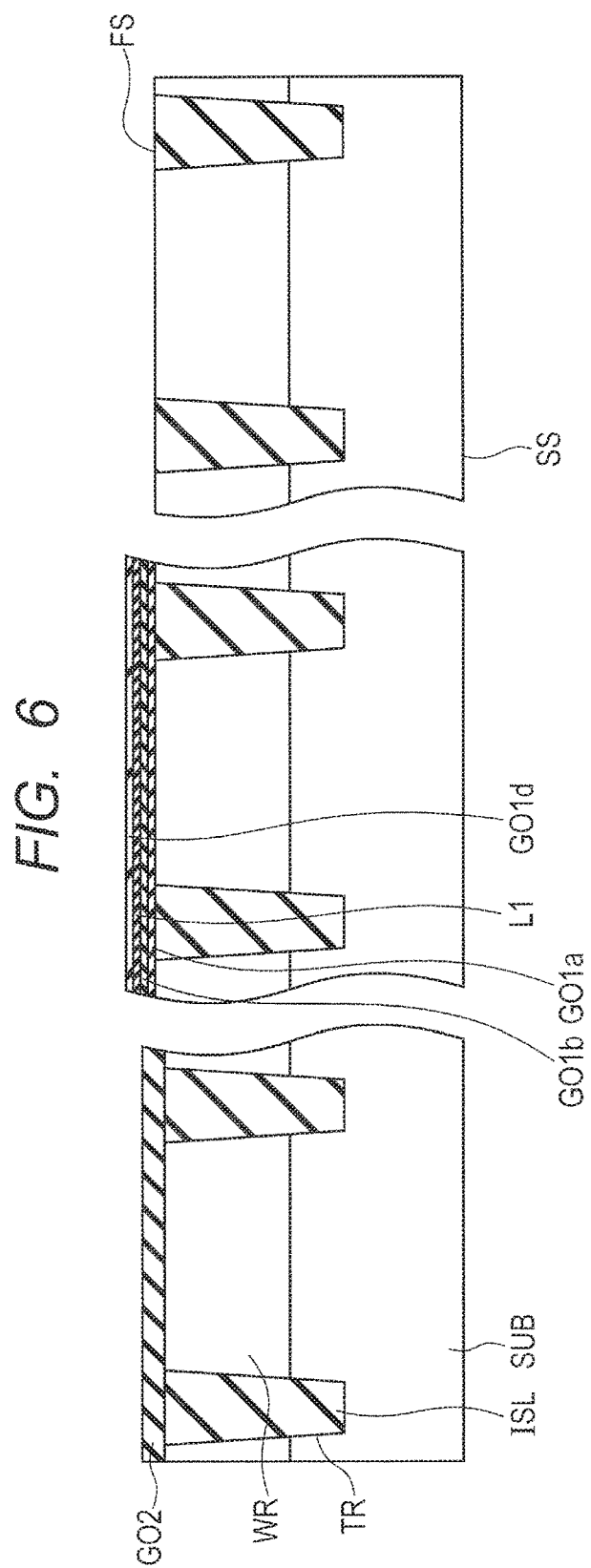
FIG. 6 is a cross-sectional view of the semiconductor device of First Embodiment in a first gate insulating film formation step.

As shown in FIG. 6, in the first gate insulating film formation step S3, a second gate insulating film GO2 is formed. In the first gate insulating film formation step S3, firstly, the first surface FS of the semiconductor substrate SUB is subjected to thermal oxidation such as ISSG oxidation. By this oxidation, a portion of the second nitride film GO1$d$ is also thermally oxidized.

In the first gate insulating film formation step S3, secondly, a portion of the second gate insulating film GO2 is removed. More specifically, a portion of the second gate insulating film GO2 formed in a region where the third gate insulating film GO3 is to be formed is removed. By this removal, the first surface FS located in the region where the third gate insulating film GO3 is to be formed is exposed.

The second gate insulating film GO2 formed in the region where the third gate insulating film GO3 is to be formed is removed by etching. With the removal of the second gate insulating film GO2 formed in the region where the third gate insulating film GO3 is to be formed, a portion of the thermally oxidized second nitride film GO1$d$ is also removed. The second nitride film GO1$d$ which has remained without being thermally oxidized becomes an etch stopper and prevents etching of the first layer L1.

With the progress of thermal oxidation of the first surface FS of the semiconductor substrate SUB, Si on the side of the first surface FS is consumed by thermal oxidation. This means that with the progress of thermal oxidation of the first surface FS of the semiconductor substrate SUB, an interface between the second gate insulating film GO2 and the semiconductor substrate SUB (in other words, the position of the first surface FS) moves to the side of the second surface SS. The height of the first surface FS in a region where the second transistor Tr2 is to be formed (in a region where the second gate insulating film GO2 is to be formed) becomes lower than the height of the first surface FS in a region where the first transistor Tr1 is formed (in the region where the first gate insulating film GO1 is formed).

Figure 7:
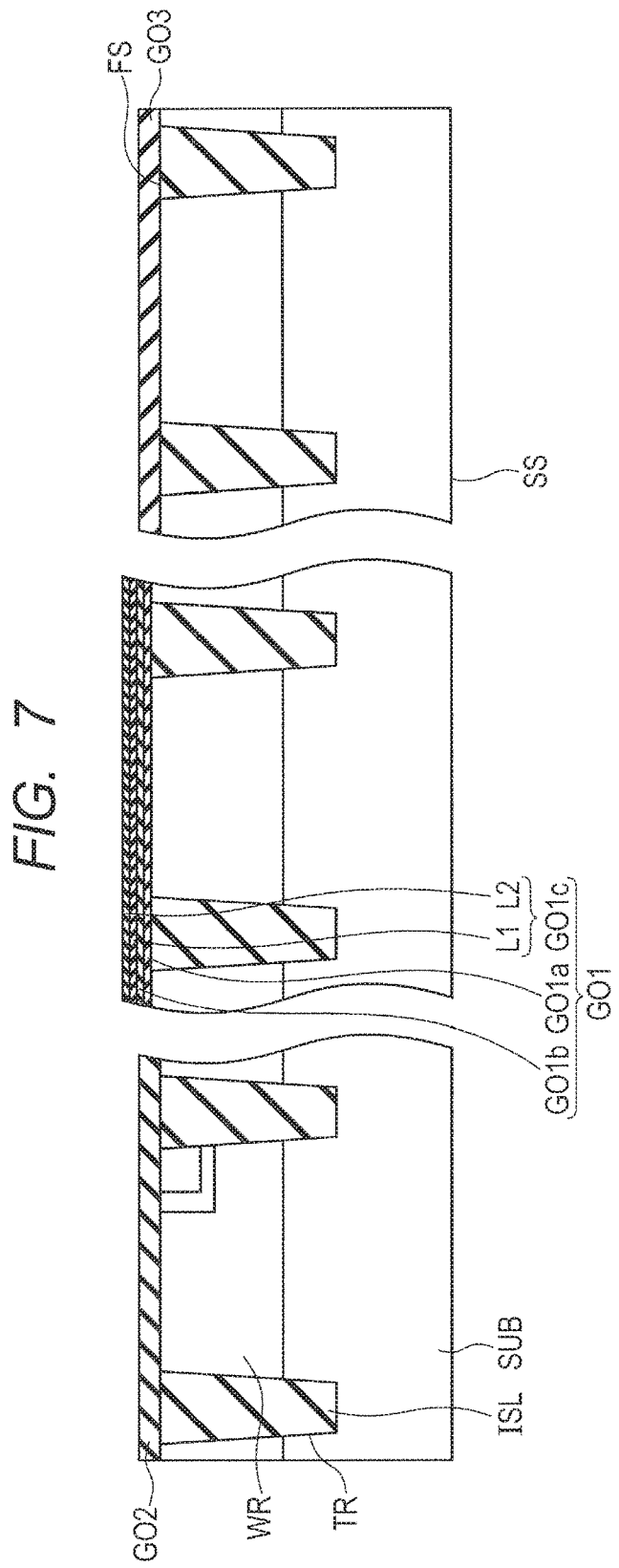
FIG. 7 is a cross-sectional view of the semiconductor device of First Embodiment in a second gate insulating film formation step.

As shown in FIG. 7, in the second gate insulating film formation step S4, a third gate insulating film GO3 is formed. The third gate insulating film GO3 is formed by subjecting the first surface FS of the semiconductor substrate SUB to thermal oxidation such as ISSG oxidation. By this step, the second nitride film GO1$d$ which has remained at the time of completion of the first gate insulating film formation step S3 is thermally oxidized into a second layer L2. Thus, the second oxide film GO1$c$ is formed by forming a second nitride film GO1$d$ on the first layer L1 and at the same time, oxidizing at least a portion of the second nitride film GO1$d$ into the second layer L2.

When the semiconductor device of First Embodiment does not have the third gate insulating film GO3, the second gate insulating film formation step S4 is not performed. In this case, the whole of the second nitride film GO1$d$ is oxidized into the second layer L2 in the first gate insulating film formation step S3 and thus, the second oxide film GO1$c$ is formed.

As described above, with the progress of thermal oxidation of the first surface FS of the semiconductor substrate SUB, the position of the first surface FS moves to the side of the second surface SS. The height of the first surface FS in the region where the third transistor Tr3 is to be formed (where the third gate insulating film GO3 is to be formed) becomes lower than the height of the first surface FS in the region where the second transistor Tr2 is to be formed (where the second gate insulating film GO2 is to be formed).

In the first gate insulating film formation step S3 and the second gate insulating film formation step S4, nitrogen is diffused into the first layer L1 from both sides (the side of the first nitride film GO1$b$ and the side of the second nitride film GO1$d$). When the second nitride film GO1$d$ is oxidized into the second layer L2, nitrogen in the second nitride film GO1$d$ is released into the atmosphere so that the nitrogen concentration in the first layer L1 becomes higher than that in the second layer L2.

Formation of the second gate insulating film GO2 and the third gate insulating film GO3 is performed after introduction of nitrogen into the first oxide film GO1a. The nitrogen concentration in the second gate insulating film GO2 and the nitrogen concentration in the third gate insulating film GO3 become lower than that in the first oxide film GO1a.

Figure 8:
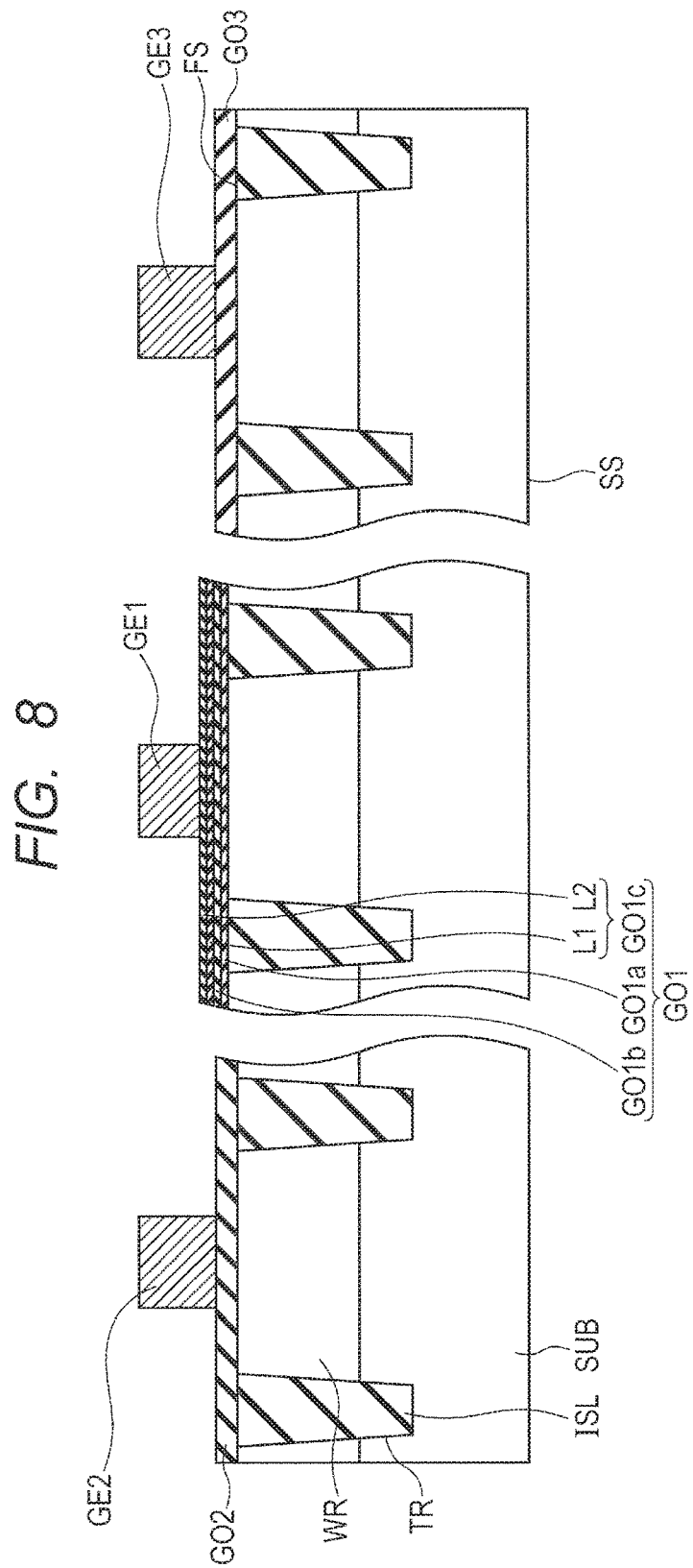
FIG. 8 is a cross-sectional view of the semiconductor device of First Embodiment in a gate electrode formation step.

As shown in FIG. 8, in the gate electrode formation step S5, a gate electrode GE1, a gate electrode GE2, and a gate electrode GE3 are formed. In the gate electrode formation step S5, firstly, film formation using respective materials configuring the gate electrode GE1, the gate electrode GE2, and the gate electrode GE3 is performed. Film formation using the respective materials configuring the gate electrode GE1, the gate electrode GE2, and the gate electrode GE3 is performed, for example, by CVD.

In the gate electrode formation step S5, secondly, patterning of the films formed using the materials configuring the gate electrode GE1, the gate electrode GE2, and the gate electrode GE3 is performed, respectively. Patterning of the films formed using the materials configuring the gate electrode GE1, the gate electrode GE2, and the gate electrode GE3, respectively, is performed, for example, by photolithography and etching.

Figure 9:
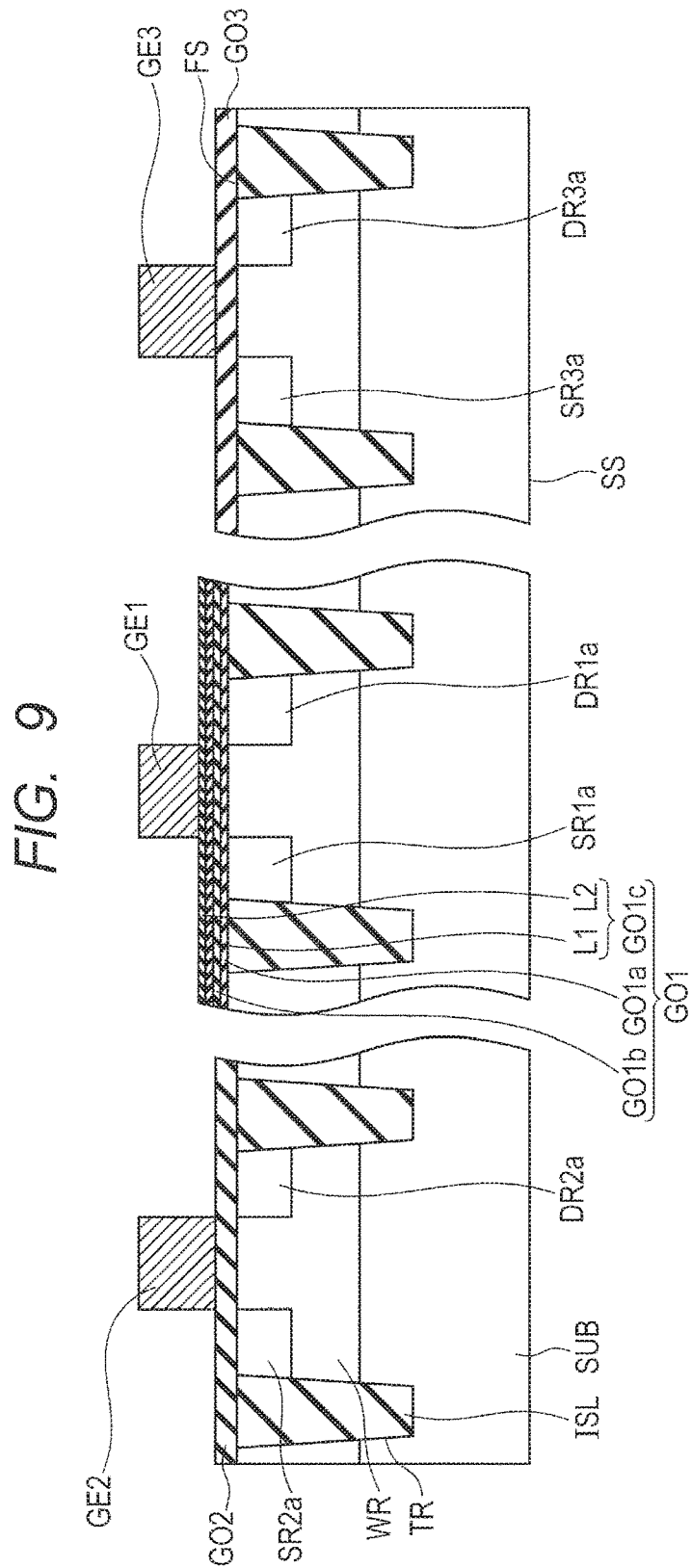
FIG. 9 is a cross-sectional view of the semiconductor device of First Embodiment in a first impurity implantation step.

As shown in FIG. 9, in the first impurity implantation step S6, a first portion SR1a, first portion SR2a, a first portion SR3a, a first portion DR1a, a first portion DR2a, and a first portion DR3a are formed. Formation of the first portion SR1a, the first portion SR2a, the first portion SR3a, the first portion DR1a, the first portion DR2a, and the first portion DR3a is performed by ion implantation with the gate electrode GE2, the gate electrode GE3, and the gate electrode GE1 as a mask.

Figure 10:
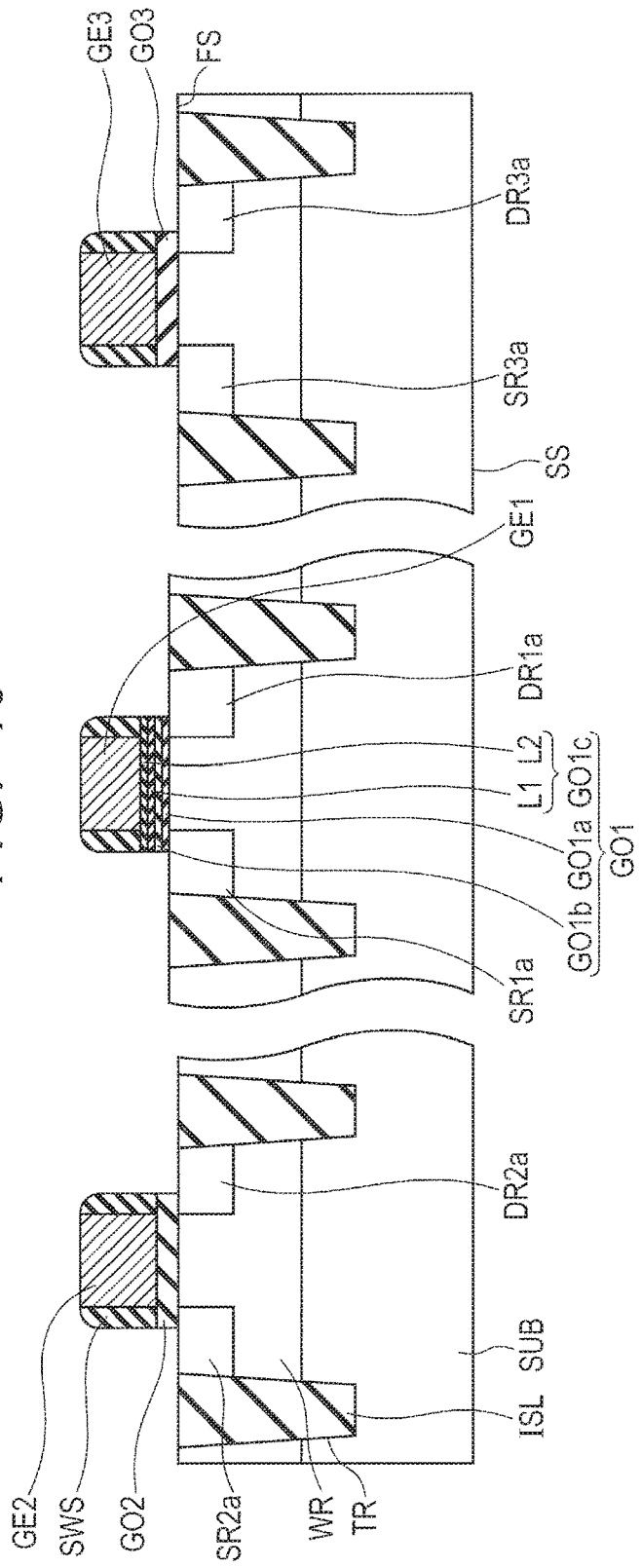
FIG. 10 is a cross-sectional view of the semiconductor device of First Embodiment in a sidewall spacer formation step.

As shown in FIG. 10, in the sidewall spacer formation step S7, a sidewall spacer SWS is formed. In the sidewall spacer formation step S7, firstly, a film is formed using a material configuring the sidewall spacers SWS. Formation of a film using the material configuring the sidewall spacers SWS is performed, for example, by CVD. In the sidewall spacer formation step S7, secondly, the film formed using the material configuring the sidewall spacers SWS is etched.

Figure 11:
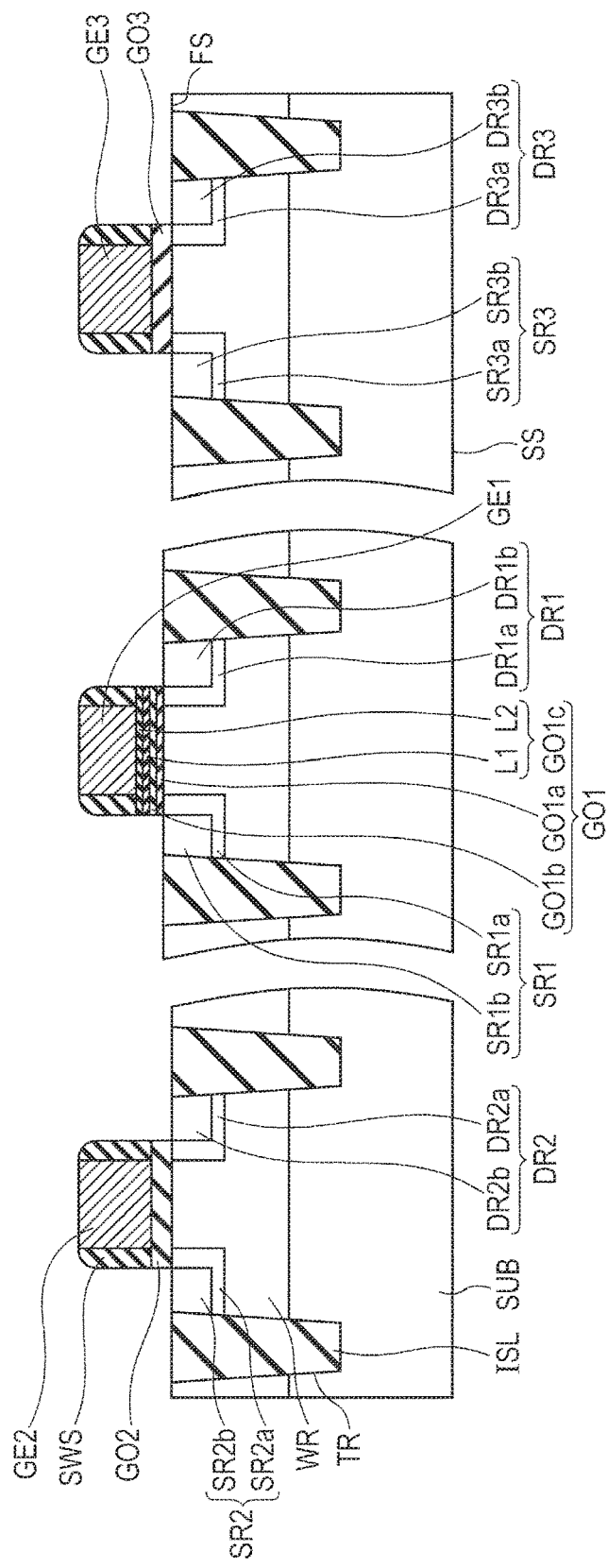
FIG. 11 is a cross-sectional view of the semiconductor device of First Embodiment in a second impurity implantation step.

As shown in FIG. 11, in the second impurity implantation step S8, a second portion SR1b, a second portion SR2b, a second portion SR3b, a second portion DR1b, a second portion DR2b, and a second portion DR3b are formed. Formation of the second portion SR1b, the second portion SR2b, the second portion SR3b, the second portion DR1b, the second portion DR2b, and the second portion DR3b is performed by ion implantation with the gate electrode GE1, the gate electrode GE2, the gate electrode GE3, and the sidewall spacers SWS as a mask.

Figure 12:
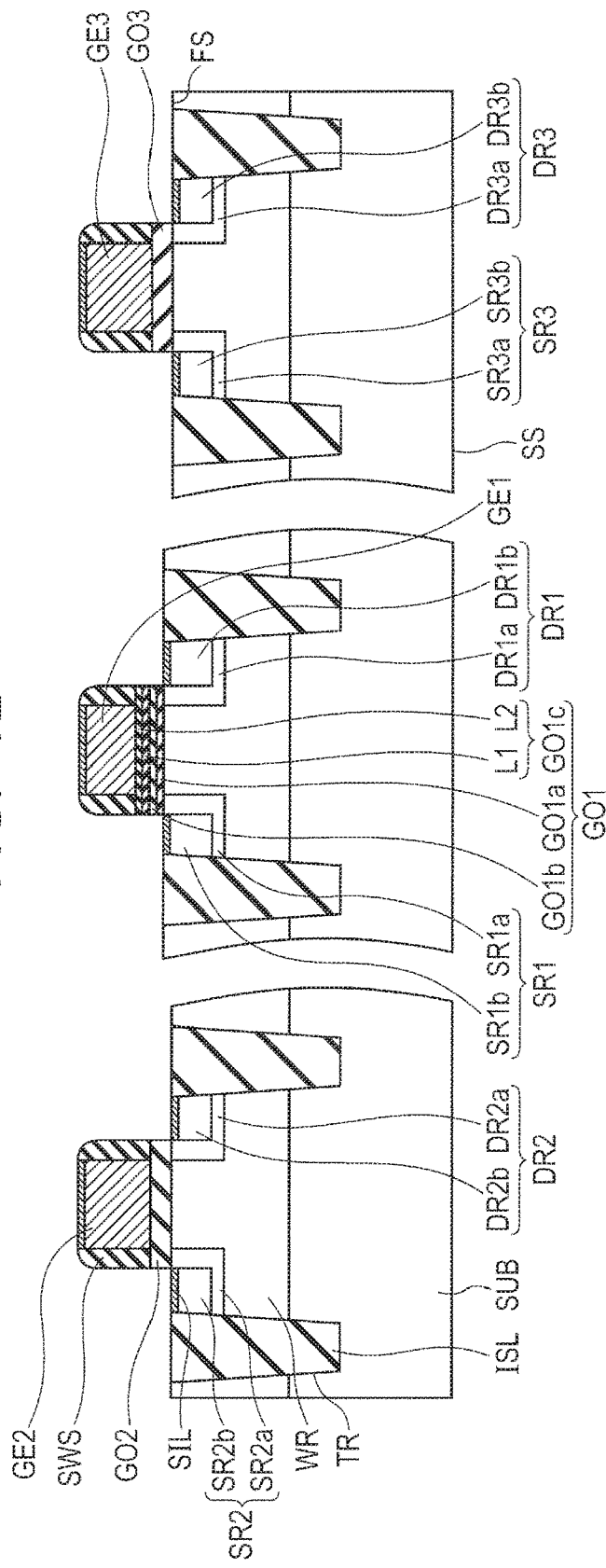
FIG. 12 is a cross-sectional view of the semiconductor device of First Embodiment in a silicidation step.

After the second impurity implantation step S8 but prior to the interlayer insulating film formation step S10, the silicidation step S9 is performed. In the silicidation step S9, as shown in FIG. 12, a silicide film SIL is formed. Described specifically, in the silicidation step S9, silicidation of the source region SR1, the source region SR2, the source region SR3, the drain region DR1, the drain region DR2, the drain region DR3, the gate electrode GE1, the gate electrode GE2, and the gate electrode GE3 is performed. In this silicidation, firstly, a nickel (Ni) film or the like is formed on the source region SR1, the source region SR2, the source region SR3, the drain region DR1, the drain region DR2, the drain region DR3, the gate electrode GE1, the gate electrode GE2, and the gate electrode GE3. Secondly, the nickel film or the like thus formed is heat treated. This heat treatment causes a reaction of Ni or the like with the semiconductor substrate SUB, the gate electrode GE1, the gate electrode GE2, and the gate electrode GE3 and thus silicidation is achieved.

Figure 13:
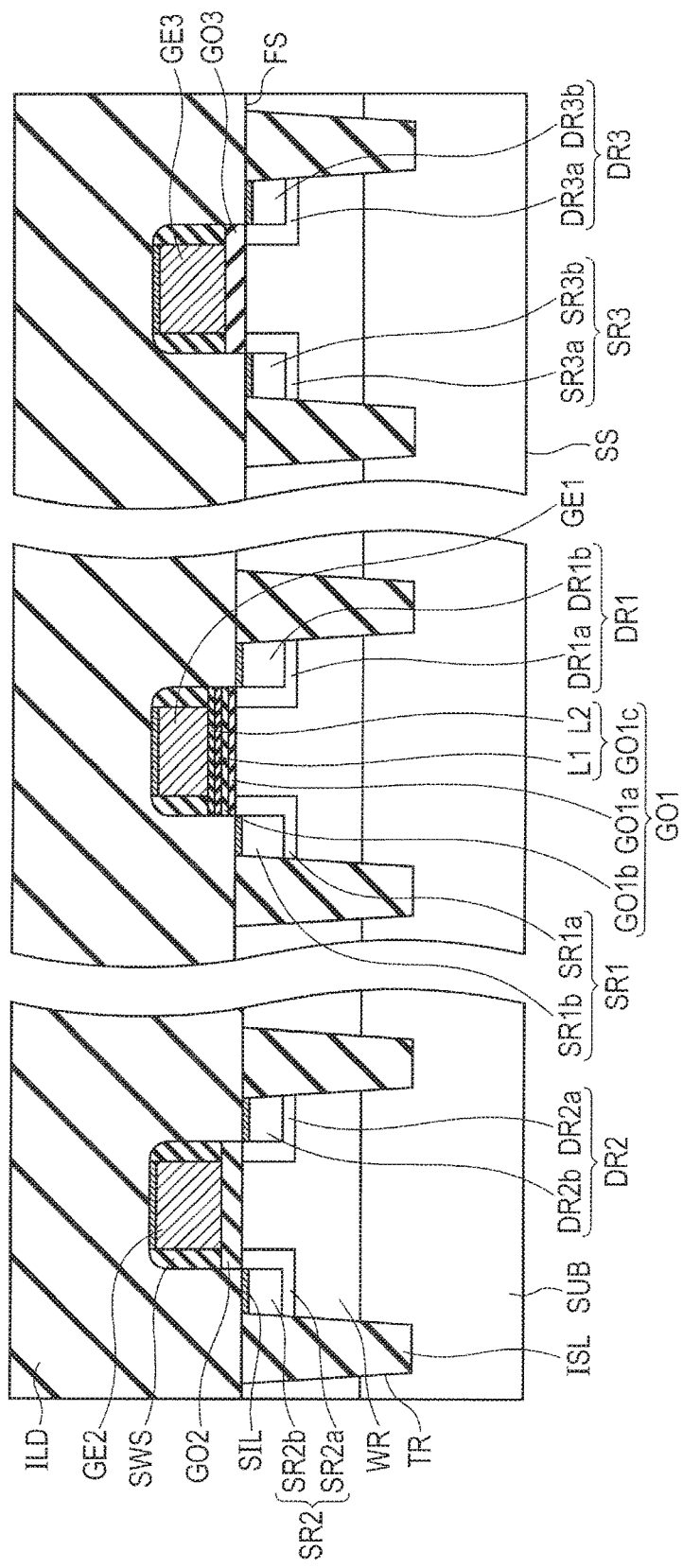
FIG. 13 is a cross-sectional view of the semiconductor device of First Embodiment in an interlayer insulating film formation step.

As shown in FIG. 13, in the interlayer insulating film formation step S10, an interlayer insulating film ILD is formed. In the interlayer insulating film formation step S10, firstly, film formation is performed using a material configuring the interlayer insulating film ILD. Film formation using the material configuring the interlayer insulating film ILD is performed, for example, by CVD. In the interlayer insulating film formation step S10, secondly, the film formed using the material configuring the interlayer insulating film ILD is planarized. This planarization is performed, for example, by CMP.

In the contact plug formation step S11, contact plugs CP are formed. In the contact plug formation step S11, firstly, contact holes CH are formed. Formation of the contact holes CH is performed, for example, by anisotropic etching, such as RIE, of the interlayer insulating film ILD.

In the contact plug formations step S11, secondly, the contact holes CH are filled with a material configuring the contact plugs CP. Filling of the contact holes CH with the material configuring the contact plugs CP is performed, for example, by CVD. In the contact plug formation step S11, fourthly, a protruding portion, from the contact holes CH, of the material configuring the contact plugs CP is removed. This removal is performed, for example, by CMP. The structure of the semiconductor device of First Embodiment shown in FIG. 2 is thus formed by the above-described steps.

After the contact plug formation step S11, a wiring formation step, an interlayer insulating film formation step, and a via plug formation step are repeated to form a multilayer wiring structure.

(Advantage of Semiconductor Device of First Embodiment)

The advantage brought by the semiconductor device of First Embodiment will hereinafter be described.

When the second oxide film GO1c is formed in the stacked film formation step S2, the second oxide film GO1c becomes too thick as a result of oxidation of the second oxide film GO1c in the first gate insulating film formation step S3 (and the second gate insulating film formation step S4).

In the stacked film formation step S2 in the semiconductor device of First Embodiment, only a portion (the first layer L1) of the second oxide film GO1c is formed. In the semiconductor device of First Embodiment, the remaining portion (the second layer L2) of the second oxide film GO1c is formed by oxidation of the second nitride film GO1d so that in the semiconductor device of First Embodiment, the thickness of the second oxide film GO1c can be optimized by optimizing the thickness of the second nitride film GO1d (the second oxide film GO1c can be prevented from becoming too thick).

As described above, in order to introduce nitrogen into the first oxide film GO1a, heat treatment is performed in an NO-containing atmosphere. This heat treatment, if performed after formation of the second gate insulating film GO2, increases the nitrogen concentration in the second gate insulating film GO2. When the second transistor Tr2 is a p channel transistor, the increase in the nitrogen concentration in the second gate insulating film GO2 may cause deterioration due to NBTI (negative bias temperature instability).

It is therefore possible to prevent the second transistor Tr2 from being deteriorated due to NBTI when the nitrogen concentration in the second gate insulating film GO2 is lower than that in the first oxide film GO1a (meaning that heat treatment for introducing nitrogen into the first oxide film GO1a is performed prior to the formation of the second gate insulating film GO2) and at the same time, the second transistor Tr2 is a p channel transistor.

Etching for removing the second gate insulating film GO2 formed in the region where the third transistor Tr3 is to be formed is performed as slight overetching. By slight overetching, remaining of the second gate insulating film GO2 in the region where the third transistor Tr3 is to be formed is prevented. When the whole of the second nitride film GO1d has been oxidized in the first gate insulating film formation step S3, this etching may remove the oxidized second nitride film GO1d and the first layer L1 immediately therebelow.

On the other hand, when the second nitride film GO1d has a thickness enough for preventing complete oxidation (thickness enough for allowing partial remaining) after the first gate insulating film formation step S3, the remaining portion of the second nitride film GO1d becomes a stopper for this etching. In this case, therefore, the first layer L1 can be prevented from being removed by this etching.

The invention made by the present inventors has so far been described specifically based on First Embodiment. It is needless to say that the invention is not limited by the embodiment, but can be changed in various ways without departing from the gist of the invention.

What is claimed is:

1. A method of manufacturing a semiconductor device, comprising the steps of:
   forming, over a first surface of a semiconductor substrate located in a region where a first transistor is to be formed, a first gate insulating film having a first oxide film, a first nitride film placed over the first oxide film, and a second oxide film placed over the first nitride film; and
   forming a second gate insulating film over the first surface located in a region where a second transistor is to be formed,
   wherein the second oxide film includes a first layer and a second layer placed over the first layer,
   wherein the first gate insulating film formation step includes a step of forming a second nitride film placed over the first layer, and
   wherein the second layer is formed by oxidation of at least a portion of the second nitride film,
   wherein the second gate insulating film is formed by thermal oxidation,
   wherein the method further comprises forming, over the first surface located in a region where a third transistor is to be formed, a third gate insulating film thinner than the second gate insulating film,
   wherein the portion of the second nitride film remains at the time of formation of the second gate insulating film,
   wherein the second nitride film oxidized at the time of formation of the second gate insulating film is removed by etching prior to the third gate insulating film formation step, and
   wherein the portion of the second nitride film which has remained at the time of formation of the second gate insulating film is oxidized into the second layer at the time of formation of the third gate insulating film.

2. The method of manufacturing a semiconductor device according to claim 1, wherein the third gate insulating film is formed by thermal oxidation.

3. The method of manufacturing a semiconductor device according to claim 1, further comprising the step of:
   introducing nitrogen into the first oxide film,
   wherein the nitrogen introduction step is performed before the second gate insulating film is formed.

* * * * *